United States Patent
Yu

(10) Patent No.: US 9,627,364 B2
(45) Date of Patent: Apr. 18, 2017

(54) COMBINED MULTICOLORED AND WHITE LED LAMP

(71) Applicant: 1 ENERGY SOLUTIONS, INC., Agoura Hills, CA (US)

(72) Inventor: Jing Jing Yu, El Monte, CA (US)

(73) Assignee: 1 ENERGY SOLUTIONS, INC., Agoura Hills, CA (US)

(*) Notice: Subject to any disclaimer, the term of this patent is extended or adjusted under 35 U.S.C. 154(b) by 0 days.

(21) Appl. No.: 15/047,526

(22) Filed: Feb. 18, 2016

(65) Prior Publication Data

US 2016/0260692 A1    Sep. 8, 2016

Related U.S. Application Data

(60) Provisional application No. 62/271,539, filed on Dec. 28, 2015, provisional application No. 62/135,078, filed on Mar. 18, 2015, provisional application No. 62/117,790, filed on Feb. 18, 2015.

(51) Int. Cl.
| | | |
|---|---|---|
| *H01L 25/075* | (2006.01) | |
| *H01L 33/48* | (2010.01) | |
| *H01L 33/54* | (2010.01) | |
| *H01L 33/62* | (2010.01) | |

(52) U.S. Cl.
CPC ........ *H01L 25/0753* (2013.01); *H01L 33/483* (2013.01); *H01L 33/54* (2013.01); *H01L 33/62* (2013.01); *H01L 2933/005* (2013.01)

(58) Field of Classification Search
CPC ..... H01L 25/0753; H01L 33/58; H01L 33/62; H01L 33/56; H01L 2933/0058; H01L 2933/0066; H01L 2933/005

USPC .......................................................... 257/89
See application file for complete search history.

(56) References Cited

U.S. PATENT DOCUMENTS

| | | | |
|---|---|---|---|
| 1,656,148 | A | 4/1926 | Harris |
| 1,677,972 | A | 7/1928 | Marks |
| 2,214,046 | A | 12/1938 | Doran |
| 2,188,529 | A | 1/1940 | Corina |
| 2,857,506 | A | 10/1958 | Minteer |
| 3,206,593 | A | 9/1965 | Winnicki, Sr. |
| 3,603,780 | A | 9/1971 | Lu |
| 3,970,834 | A | 7/1976 | Smith |

(Continued)

FOREIGN PATENT DOCUMENTS

| | | |
|---|---|---|
| CN | 2292482 | 4/1997 |
| CN | 2643777 | 8/2003 |

(Continued)

OTHER PUBLICATIONS

Artificial Christmas Tree Assembly, Use & Care Instructions, Balsam Hill; https://web.archive.org/web/20100706111614/http://www.balsamhill.com/ARticles.asp?ID . . . printed Jan. 24, 2014.

*Primary Examiner* — Fernando L Toledo
*Assistant Examiner* — Adam S Bowen
(74) *Attorney, Agent, or Firm* — William W. Cochran; Cochran Freund & Young LLC

(57) ABSTRACT

Disclosed is a combined light emitting diode lamp that utilizes a multicolored light emitting diode that is capable of creating a full spectrum of colors. Attached to the multicolored lamp is a white light emitting diode lamp that provides a bright white signal that is consistent from one combined LED lamp to another.

8 Claims, 8 Drawing Sheets

(56) References Cited

U.S. PATENT DOCUMENTS

| | | |
|---|---|---|
| 3,985,924 A | 10/1976 | Pritza |
| 4,020,201 A | 4/1977 | Miller |
| 4,060,722 A | 11/1977 | Foley |
| 4,068,118 A | 1/1978 | Carrington |
| 4,364,102 A | 12/1982 | Huppert et al. |
| 4,573,102 A | 2/1986 | Norwood |
| 5,517,390 A | 5/1996 | Zins |
| 5,609,412 A | 3/1997 | Contigiani |
| 5,855,705 A | 1/1999 | Gauthier |
| 6,017,142 A | 1/2000 | Harris, Jr. |
| 6,228,442 B1 | 5/2001 | Coco |
| 6,942,355 B1 | 9/2005 | Castiglia |
| 6,951,405 B2 | 10/2005 | Yao |
| 7,052,156 B2 | 5/2006 | Primeau |
| 7,055,981 B2 | 6/2006 | Yao |
| 7,132,139 B2 | 11/2006 | Yang |
| 7,445,824 B2 | 11/2008 | Leung et al. |
| 7,896,516 B1 | 3/2011 | Zhu |
| 8,298,633 B1 | 10/2012 | Chen |
| 8,454,186 B2 | 6/2013 | Chen |
| 8,454,187 B2 | 6/2013 | Chen |
| D686,523 S | 7/2013 | Chen |
| 8,568,015 B2 | 10/2013 | Chen |
| D696,153 S | 12/2013 | Chen |
| 2005/0180163 A1 | 8/2005 | Huang |
| 2006/0044822 A1 | 3/2006 | Katsumata |
| 2006/0164834 A1 | 7/2006 | Kao |
| 2007/0092664 A1 | 4/2007 | Chun |
| 2007/0177402 A1 | 8/2007 | Wu |
| 2007/0253191 A1 | 11/2007 | Chin et al. |
| 2009/0029075 A1 | 1/2009 | Barthelmess |
| 2009/0080185 A1* | 3/2009 | McMillan ............... F21K 9/00 362/231 |
| 2010/0072747 A1 | 3/2010 | Krize |
| 2012/0076957 A1 | 3/2012 | Chen |
| 2013/0059094 A1 | 3/2013 | Chen |
| 2013/0108808 A1 | 5/2013 | Leung et al. |
| 2013/0120971 A1 | 5/2013 | Chen |
| 2013/0163231 A1 | 6/2013 | Chen |
| 2013/0301245 A1 | 11/2013 | Chen |
| 2013/0301246 A1 | 11/2013 | Chen |
| 2013/0301247 A1 | 11/2013 | Chen |
| 2013/0308301 A1 | 11/2013 | Chen |
| 2014/0036483 A1 | 2/2014 | Chen |

FOREIGN PATENT DOCUMENTS

| | | |
|---|---|---|
| CN | 2812761 | 9/2004 |
| CN | 2751226 | 11/2004 |
| CN | 2769694 | 11/2004 |
| CN | 201318583 | 11/2008 |
| DE | 8436328 | 4/1985 |
| DE | 10235081 | 8/2002 |
| EP | 1887280 | 8/2006 |
| GB | 1490174 | 12/1975 |
| GB | 2112281 | 10/1981 |
| GB | 2137086 | 2/1983 |
| GB | 2161595 | 7/1984 |
| GB | 2172135 | 3/1986 |
| GB | 2382772 | 12/2001 |
| GB | 2471475 | 6/2009 |
| GB | 2496290 | 10/2012 |
| NL | 9400893 | 1/1994 |
| WO | 9626661 | 9/1996 |
| WO | 2010057426 | 5/2010 |

* cited by examiner

COMBINED MULTICOLORED AND WHITE LED LAMP

BACKGROUND

Light emitting diodes (LEDs) have provided an alternative to standard incandescent lighting systems. LEDs consume considerably less electrical power than incandescent bulbs because of the high efficiency of LEDs in converting electrical energy into photons. Further, LEDs generate considerably less heat in the process of generating light than incandescent bulbs that create an equivalent amount of light. Further, LEDs can be constructed to produce different colors or frequencies so that coloration of bulbs, which is common in incandescent lights, is not required to produce different colors. The coloration of bulbs in incandescent lights reduces the output efficiency of the light generated by the incandescent bulbs. Rather, LEDs are designed to emit different color frequencies, so that bulb or lens coloration is not required. As such, LEDs are being used ubiquitously for numerous lighting solutions.

SUMMARY

An embodiment of the present invention may therefore comprise a combined light emitting diode lamp comprising: a plurality of light emitting diodes having different colors that are encapsulated in a lens material, to form a multicolored light emitting diode lamp, the multicolored light emitting diode lamp having at least two leads for activating the multicolored light emitting diode lamp to emit a substantially full spectrum of visible colors; a white light emitting diode lamp, the combined light emitting diode lamp being capable of creating a substantially achromatic white light and that is encapsulated in a lens material that is mechanically connected to the lens material of the multicolored light emitting diode lamp to form the combined light emitting diode lamp, that is capable of generating a substantially full spectrum of visible colors from the multicolored light emitting diode lamp and that is capable of generating a substantially uniform and consistent white light that is substantially achromatic from said white light emitting diode lamp.

An embodiment of the present invention may further comprise a method of generating a substantially full spectrum of visible colors and a white light that is substantially achromatic in a combined light emitting diode lamp comprising: providing a plurality of semiconductor dies that emit various spectral frequencies; providing a first lens that encapsulates the plurality of semiconductor dies; providing at least one semiconductor die that emits the white light that is substantially achromatic; providing a second lens that encapsulates the at least one semiconductor die that emits white light; mechanically connecting the first lens material and the second lens material to form the combined light emitting diode lamp.

DETAILED DESCRIPTION OF THE EMBODIMENTS

Figure 1:
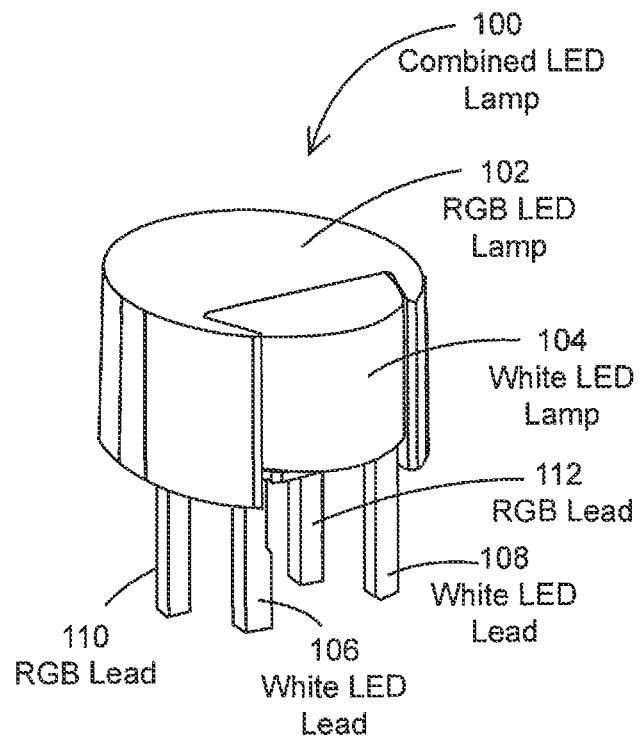
FIG. 1 is an isometric view of a combined LED lamp.

FIG. 1 is an isometric view of an embodiment of a combined LED lamp 100 that includes an RGB LED lamp 102 and a white LED lamp 104 that are joined together or mechanically coupled together. Although FIG. 1 illustrates one manner of mechanically coupling or joining the RGB LED lamp 102 and the white LED lamp 104, any desired method of mechanically coupling or joining these lamps to create a combined LED lamp 100 can be used. The advantage of using the configuration of FIG. 1 is that the form factor for the combined LED lamp 100 is a standard form factor for LED lamps. As also illustrated in FIG. 1, the RGB LED lamp 102 has two leads, RGB lead 110 and RGB lead 112. One of these leads may comprise the anode, while the other lead may comprise the cathode. Further, the white LED lamp 104 has two leads, i.e., white LED lead 106 and white LED lead 108. One of these leads may comprise the anode, while the other lead comprises the cathode.

Figure 2:
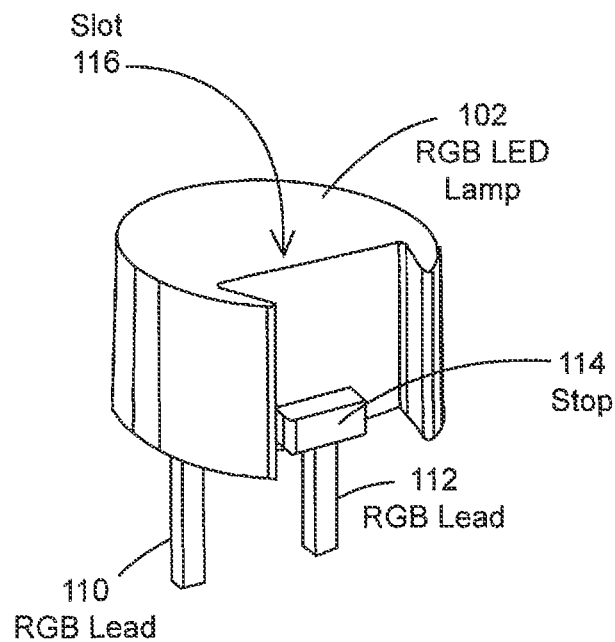
FIG. 2 is a perspective view of an RGB LED lamp.

FIG. 2 is an isometric view of the embodiment of the RGB LED lamp 102 illustrated in FIG. 1. As illustrated in FIG. 2, the RGB LED lamp 102 has an RGB lead 110 and an RGB lead 112. A stop 114 is located in the center of the slot 116 of the RGB LED lamp 102, which stops the white LED lamp 104 from sliding downwardly too far in the slot 116, illustrated in Figure.

Figure 3:
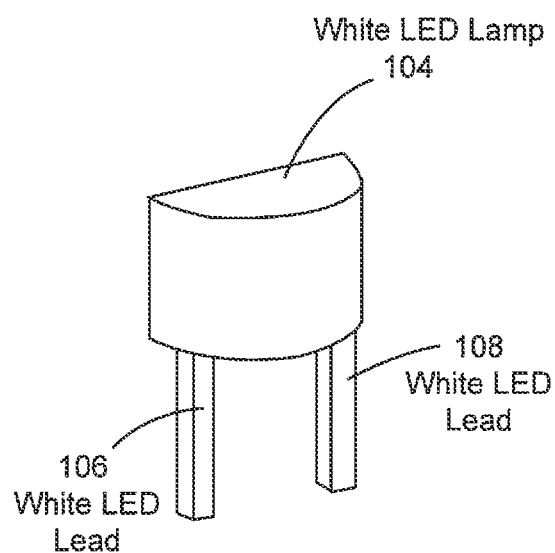
FIG. 3 is a perspective view of a white LED lamp.

FIG. 3 is a schematic isometric diagram of the white LED lamp 104. The white LED lamp 104 has white LED lead 106 and white LED lead 108. The white LED lamp 104 has a notch (not shown) for locating the white LED lamp on the stop 114, illustrated in FIG. 2. When the white LED lamp 104 is slid into the slot 116 and engages the stop 114, the white LED lamp 104 is substantially flush with the RGB LED lamp 102, as illustrated in FIG. 1. In this manner, light from the RGB LED lamp 102 and light from the white LED lamp 104 can be projected outwardly without restriction.

Figure 4:
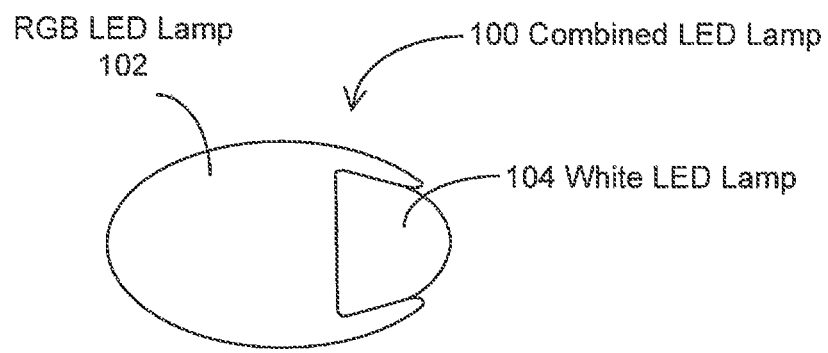
FIG. 4 is a top view of the combined LED lamp of FIG. 1.

FIG. 4 is a schematic top view of the embodiment of the combined LED lamp 100 illustrated in FIG. 1. As shown in FIG. 4, the RGB LED lamp 102 has an opening in which the white LED lamp 104 is disposed. In this manner, the combined LED lamp 100 is created.

Figure 5:
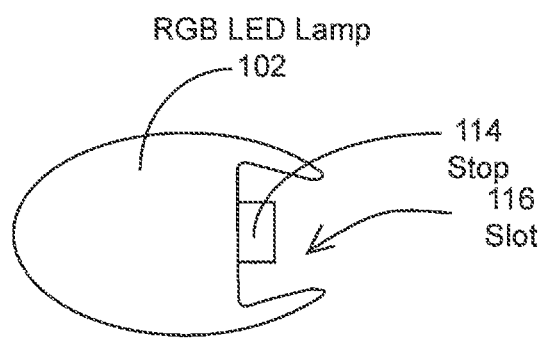
FIG. 5 is a top view of the RGB LED lamp of FIG. 2.

FIG. 5 is a top view of the RGB LED lamp 102. As shown in FIG. 5, the RGB LED lamp 102 includes stop 114, which is disposed in the opening, or slot, 116 for the white LED lamp 104.

Figure 6:
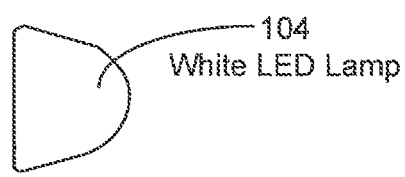
FIG. 6 is a top view of the white LED lamp of FIG. 3.

FIG. 6 is a top view of the white LED 104. As illustrated in FIG. 6, the white LED lamp 104 has a shape to fit in the opening, i.e., slot 116, and mechanically secured to the RGB LED lamp 102 of FIG. 5.

Figure 7A:
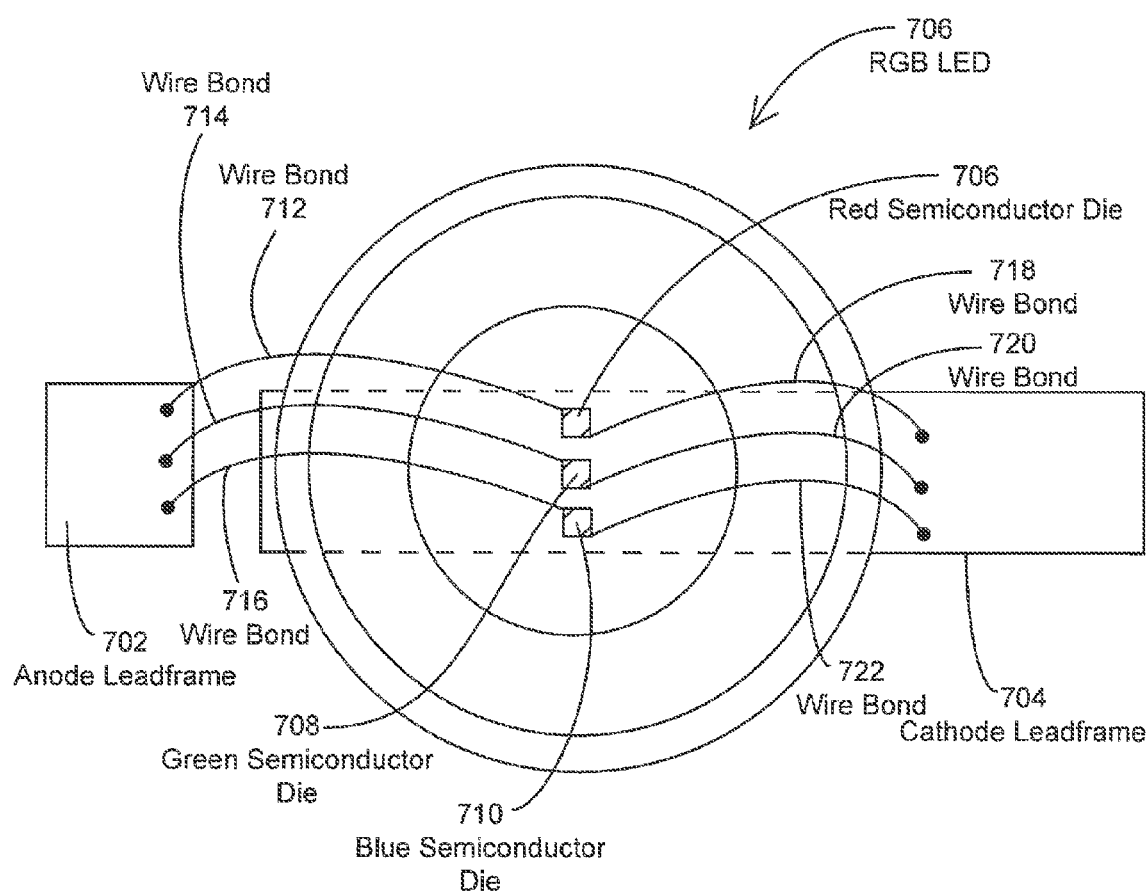
FIG. 7A is a schematic diagram of an embodiment of an RGB LED.

FIG. 7A is a schematic top view of an embodiment of an RGB LED lamp 700. As illustrated in FIG. 7A, the RGB LED lamp 700 includes an anode leadframe 702 and a cathode leadframe 704. Three semiconductor dies are disposed on the cathode leadframe 704. The red semiconductor die 706 generates red light. Wire bond 712 connects red semiconductor die 706 to the anode leadframe 702, while wire bond 718 connects the red semiconductor die 706 to the cathode leadframe 704. Green semiconductor die 708 generates spectral emissions in the green spectral range. Blue semiconductor die 710 generates spectral emissions in the blue spectral range. Wire bond 712 connects red semiconductor die 706 to the anode leadframe 702. Wire bond 714 connects the green semiconductor die 708 to the anode leadframe 702. Wire bond 716 connects blue semiconductor die 710 to the anode leadframe 702. Wire bond 718 connects the red semiconductor die 706 to the cathode leadframe 704. Wire bond 720 connects the green semiconductor die 708 to the cathode leadframe 704. Wire bond 722 connects the blue semiconductor die 710 to the cathode leadframe 704. Each of the dies 706, 708, 710 contain decoding circuitry that decodes an encoded signal that is generated by a controller (not shown) that generates an encoded signal to instruct each of the dies 706, 708, 710 to illuminate (or not illuminate) with a certain intensity. In this manner, each of the dies 706, 708, 710 will be illuminated to create a combined emission to create a color. In the present example, the use of red, green and blue dies allows the generation of a full spectrum of colors. Alternatively, magenta, cyan and yellow are also capable of creating a full spectrum of colors. Because of the close proximity of the dies 706, 708, 710, the emissions of each of the dies are combined to generate the combined color emission. The intensity of the emissions of each of the dies results in the color that occurs in the combined emission. For example, if the red semiconductor die 706 and the green semiconductor die 708 are emitting nothing or very small intensity emissions, and the blue semiconductor die 710 is emitting full power emissions, the combined emission will appear blue.

In order to generate white light, all three of the semiconductor dies, i.e., red semiconductor die 706, green semiconductor die 708, and blue semiconductor die 710, must be on and have the same intensity. In order to get a pure white achromatic combined emission, each of the red, green and blue colors must be exact. In addition, each of the dies must emit at the same exact power. Consequently, achromatic white light is hard to achieve using simply the RGB LED lamp 700. A pure white, or bright white, that is achromatic, is very difficult to achieve. However, a bright achromatic white is especially pleasing as decorative lighting.

As a result of process control variations and other factors, it is difficult to create an RGB lamp, such as RGB LED lamp 700, illustrated in FIG. 7A, that is capable of creating a substantially achromatic white light emission. In that regard, the emission may certainly be white, but may not be purely achromatic. In other words, some slight color may exist in the white emission for various reasons. The term substantially achromatic means that a color tint to the white light is not apparent to an observer and that the white light appears as a bright white light, rather than a soft or colored white. Empirically, the white light emitted by red, green, blue LEDs, such as RGB LED lamp 700, rarely create a clear, bright white, substantially achromatic emission. Further, the variations that exist from one multicolored LED to another multicolored LED do not provide a consistent white that is substantially achromatic.

Figure 7B:
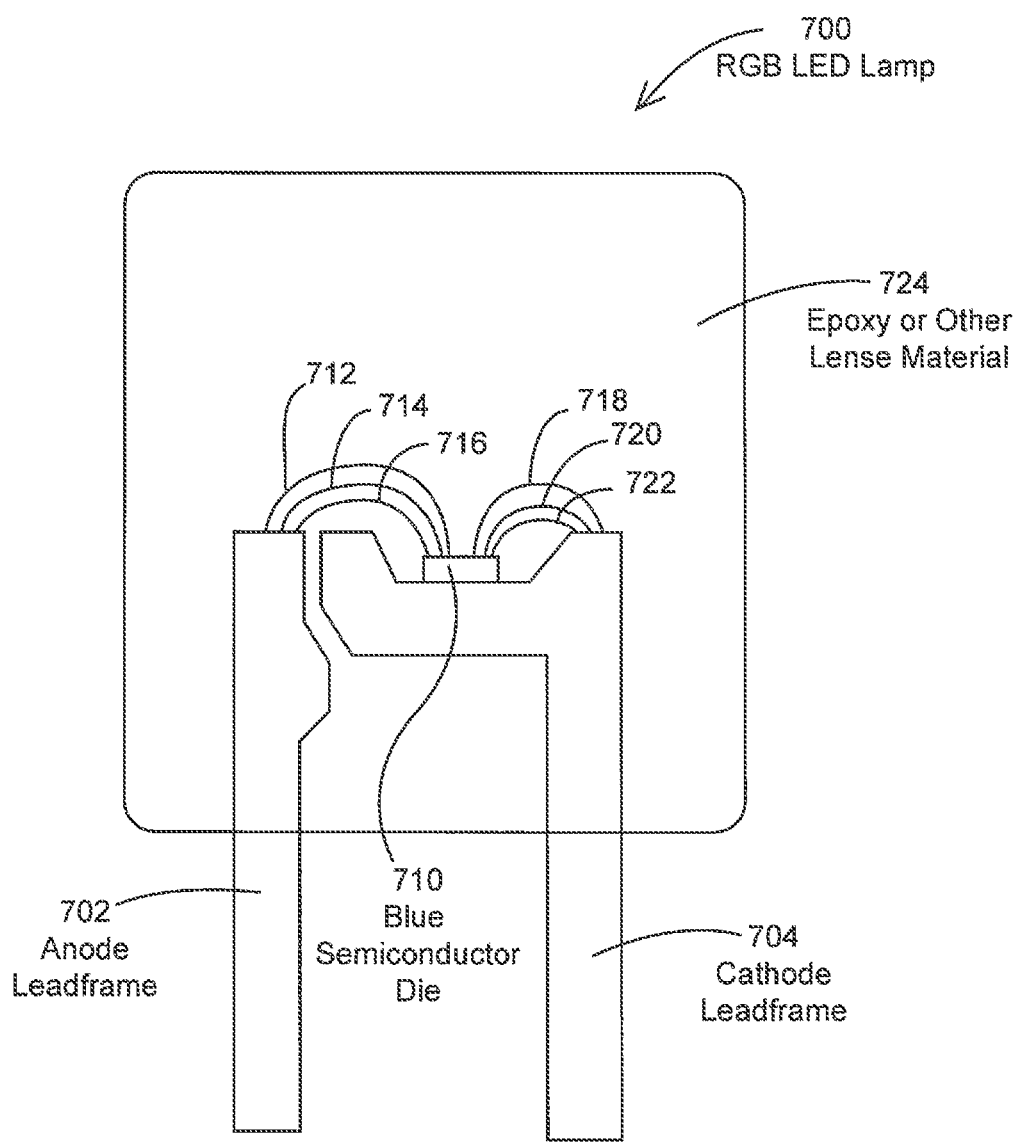
FIG. 7B is a side view of the embodiment of FIG. 7A.

FIG. 7B is a side view of the RGB LED lamp 700 of FIG. 7A. As shown in FIG. 7B, the RGB LED lamp 700 includes an anode leadframe 702 and a cathode leadframe 704. The cathode leadframe 704 includes an anvil in which the semiconductors are located. As shown in the side view of the FIG. 7B, wire bonds 712, 714, 716 connect the three semiconductor dies to the anode leadframe 702. Wire bonds 718, 720, 722 connect the three semiconductor dies to the cathode leadframe 704. Both power and encoded signals can be supplied to the semiconductor dies through the leadframes, such as anode leadframe 702 and cathode leadframe 704. The blue semiconductor die 710 is illustrated in the side view of FIG. 7B. Epoxy 724, or other lens material, can be used to encapsulate the structure shown in FIG. 7B. In some high powered LEDs, a plastic material is preferred as the lens material 724.

Figure 8:
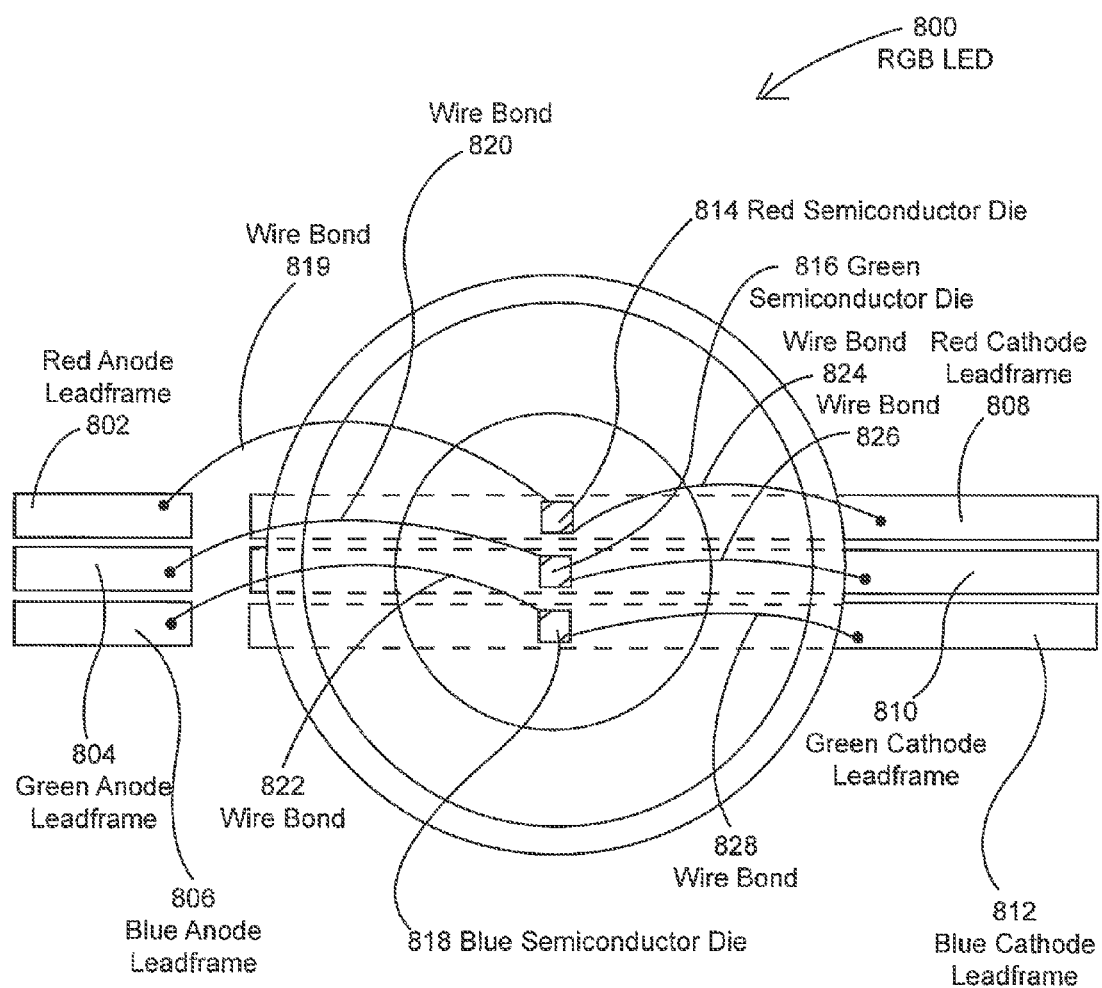
FIG. 8 is a schematic top view of an embodiment of an RGB LED.

FIG. 8 is a schematic top view of an alternative embodiment of an RGB LED 800. The RGB LED 800 includes a red anode leadframe 802, a green anode leadframe 804, and a blue anode leadframe 806. As also illustrated in FIG. 8, the RGB LED 800 includes a red cathode leadframe 808, a green cathode leadframe 810 and a blue cathode leadframe 812. In this manner, electrical signals can be applied to the anode leadframes 802, 804, 806 and the cathode leadframes 808, 810, 812 to separately activate each of the semiconductor dies, i.e., red semiconductor die 814, green semiconductor die 816, and blue semiconductor die 818. Wire bond 819 connects the red semiconductor the 814 to the red anode leadframe 802. Wire bond 820 connects the green semiconductor die 816 to green anode leadframe 804. Wire bond 822 connects the blue semiconductor die 818 to the blue anode leadframe 806. Wire bond 824 connects the red semiconductor die 814 to the red cathode leadframe 808. Wire bond 826 connects the green semiconductor die 816 to the green cathode leadframe 810. Wire bond 828 connects the blue semiconductor die 818 to the blue cathode leadframe 812. Utilizing the structure of the RGB LED 800 that is illustrated in FIG. 8, individual power signals can be applied to each of the semiconductor dies, i.e., red semiconductor die 814, green semiconductor die 816 and blue semiconductor die 818, to apply the desired amount of voltage and current to dies 814-818 to create the desired combined color. In this manner, encoded signals are not required to activate each of the semiconductor dies 814-818 that are required in the RGB LED embodiments of FIGS. 7A and 7B.

Figure 9:
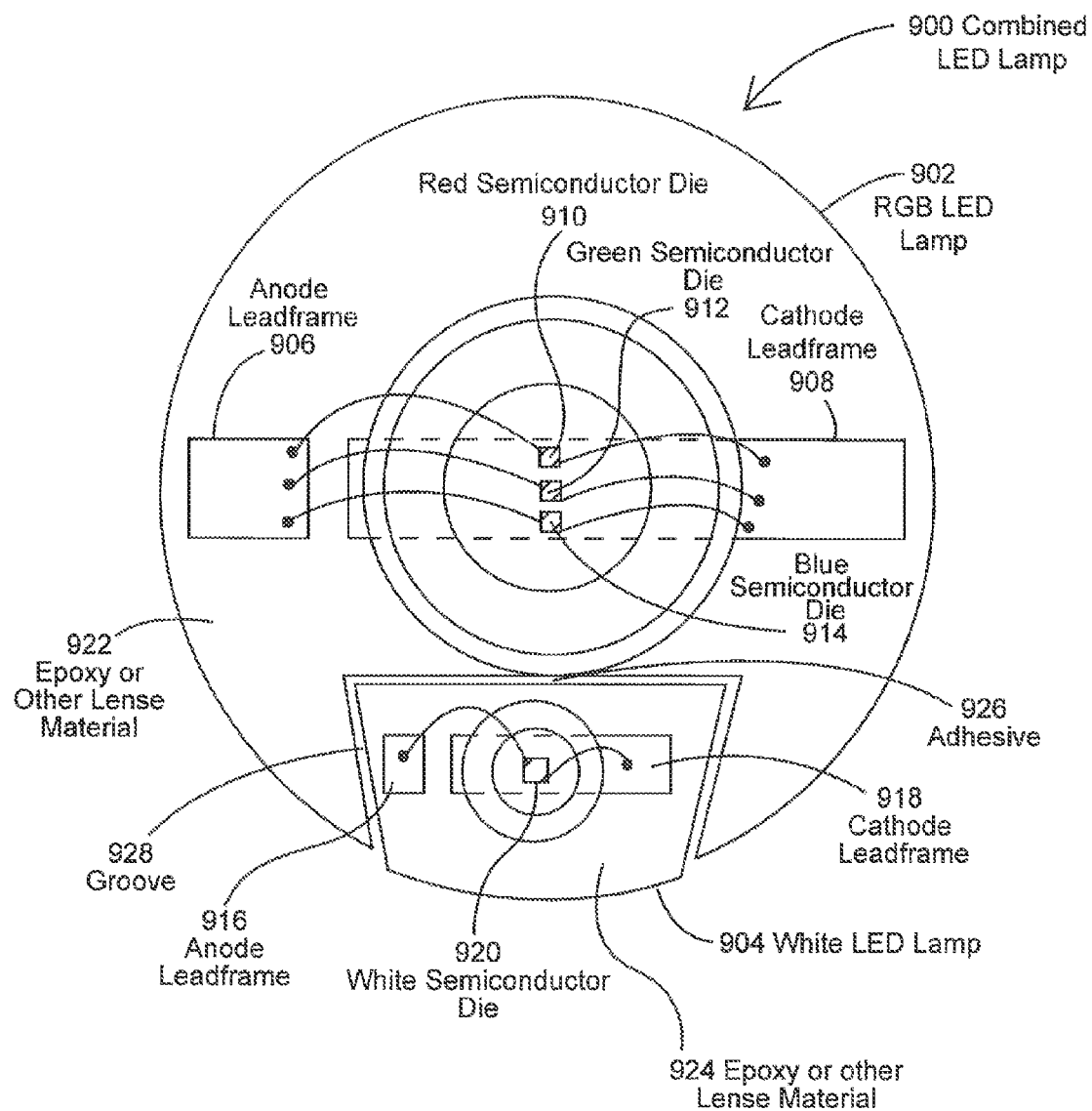
FIG. 9 is a schematic top view of an embodiment of a combined LED lamp.

FIG. 9 is a schematic top view of a combined LED lamp 900, which includes an RGB LED lamp 902 and a white LED lamp 904 that are mechanically connected. As illustrated in FIG. 9, the RGB LED lamp 902 has an anode leadframe 906 and a cathode leadframe 908. There are three different colored semiconductor dies, that are mounted on the cathode leadframe 908, i.e., red semiconductor die 910, green semiconductor die 912, and blue semiconductor die 914. The RGB LED lamp 902 is encapsulated in an epoxy 922, or other lens material. The epoxy 922, or other lens material, has a groove 928 formed in an outer section that is shaped to receive the white LED lamp 904. The white LED lamp 904 includes an anode leadframe 916, a cathode leadframe 918, and a white semiconductor die 920 that is mounted on the cathode leadframe 918. The white LED lamp 904 is encapsulated in an epoxy 924, or other lens material. Other lens materials may include plastics that are capable of being exposed to high power emissions from the white semiconductor die 920. White semiconductor die 920 produces a consistent bright white emission that is substantially achromatic, i.e., does not appear to contain colors to an observer. The epoxy, or other lens material 924, is shaped to fit within the groove 928 of the epoxy 922 of the RGB LED lamp 902. This may be a friction fit, or the epoxy 924 may be bonded to the epoxy 922 using an adhesive 926. The combined LED lamp 900 is therefore capable of creating a full spectrum of colors, as well as an achromatic white light from the white LED lamp 904.

Figure 10:
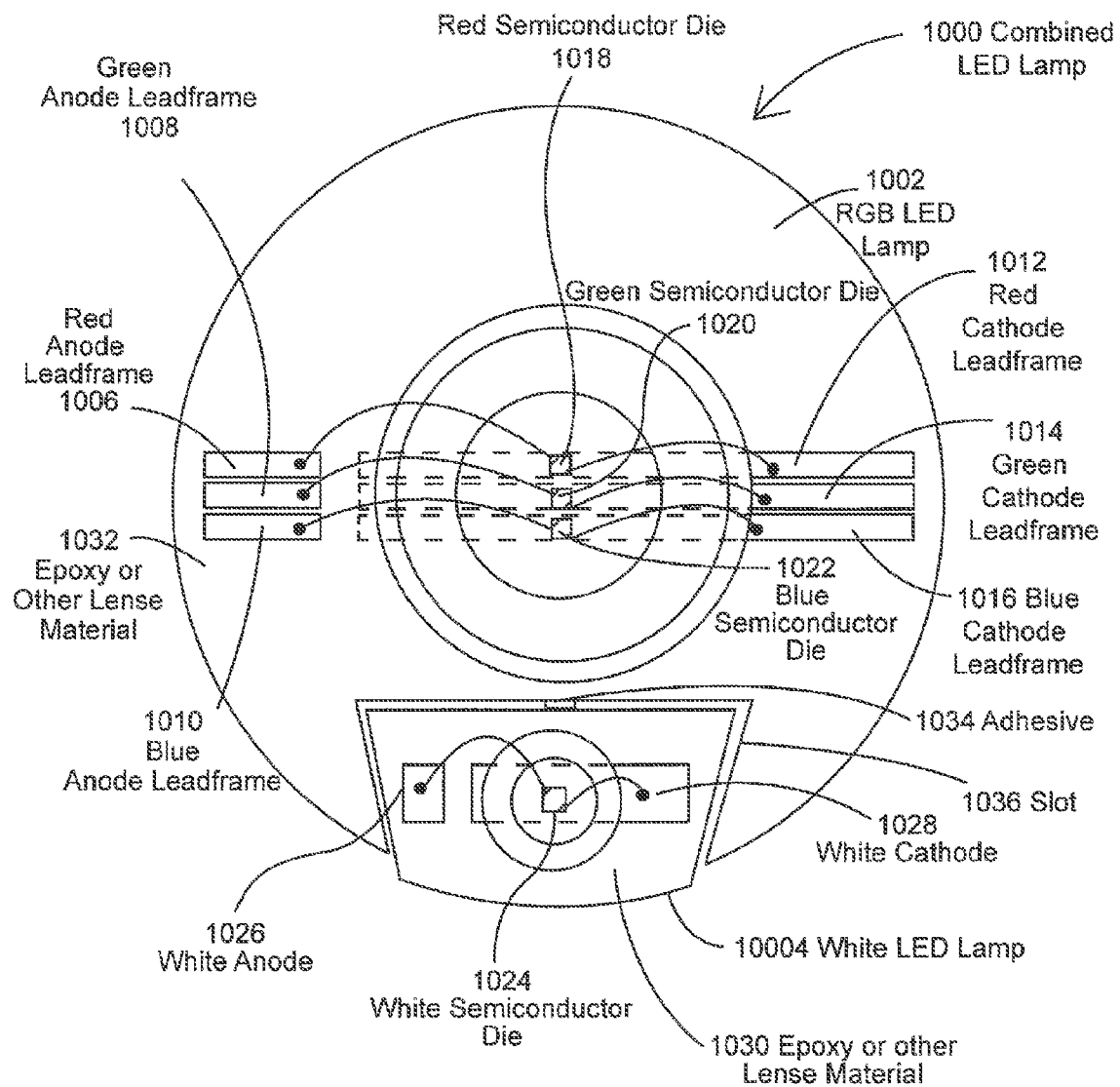
FIG. 10 is a schematic top view of another embodiment of a combined LED lamp.

FIG. 10 is a top schematic view of another embodiment of a combined LED lamp 1000. As illustrated in FIG. 10, the combined LED lamp 1000 comprises RGB LED lamp 1002 and white LED lamp 1004. RGB LED lamp 1002 is capable of creating a full spectrum of colors, while white LED lamp 1004 creates a pure bright white emission that is substantially achromatic. In this manner, the combined LED lamp 1000 is capable of creating a consistent bright white achromatic emission, as well as a full spectrum of colors. The RGB LED lamp 1002 includes red semiconductor die 1018, green semiconductor die 1020 and blue semiconductor die 1022. These color dies 1018, 1020, 1022 are activated by power applied to red anode leadframe 1006, green anode leadframe 1008, blue anode leadframe 1010, red cathode leadframe 1012, green cathode leadframe 1014, and blue cathode leadframe 1016, in the manner disclosed above. The white LED lamp 1004 has a white semiconductor die 1024 that is placed on the white cathode 1028. The white semiconductor die 1024 is electrically connected to the white anode 1026 and the white cathode 1028. The structure of the white LED lamp 1004 is encased in epoxy 1030, or other lens material. The epoxy 1030 is shaped to fit within the slot 1036 with either a friction fit, or the epoxy 1030 can be glued to the epoxy 1032 of the RGB LED lamp 1002 with adhesive 1034. Of course, any shape can be used in place of the slot 1036 in the epoxy 1032, such that the epoxy 1030 can be shaped to mechanically attach to the epoxy 1032. The combined LED lamp 1000, illustrated in FIG. 10, is therefore capable of creating a full spectrum of colors from the RGB LED lamp 1002 and a substantially bright white emission, which is substantially achromatic from the white LED lamp 1004.

As such, the combined LED lamp is capable of creating both a full spectrum of colors, as well as a bright white light that is consistent from lamp to lamp, in a single package. The colored semiconductor dies can either be activated using encoded signals or separate leads can be provided on which power signals can be used to activate the individually colored dies.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A combined light emitting diode lamp comprising:
a plurality of light emitting diodes having different colors that are encapsulated in a lens material, to form a multicolored light emitting diode lamp, said multicolored light emitting diode lamp having at least two leads for activating said multicolored light emitting diode lamp to emit a substantially full spectrum of visible colors, said multicolored light emitting diode lamp comprising:
  a plurality of semiconductor dies placed on a single leadframe, that are wired to both an anode leadframe and a cathode leadframe, that receive encoded signals;
  decoders disposed on said plurality of semiconductor dies that are capable of decoding said encoded signals to create a decoded intensity signal, so that said plurality of semiconductor dies are illuminated with an intensity that corresponds to said decoded intensity signal;
a white light emitting diode lamp that is capable of creating a substantially achromatic white light and that is encapsulated in a lens material that is mechanically connected to said lens material of said multicolored light emitting diode lamp to form said combined light emitting diode lamp, said combined light emitting diode lamp being capable of generating a substantially full spectrum of visible colors from said multicolored light emitting diode lamp, and that is capable of generating a substantially uniform and consistent white light that is substantially achromatic from said white light emitting diode lamp.

2. A combined light emitting diode lamp comprising:
a plurality of light emitting diodes having different colors that are encapsulated in a lens material, to form a multicolored light emitting diode lamp, said multicolored light emitting diode lamp having at least two leads for activating said multicolored light emitting diode lamp to emit a substantially full spectrum of visible colors, said multicolored light emitting diode lamp comprising:
  a plurality of semiconductor dies that are each placed on a separate leadframe and that are wired to separate anode leadframes and separate cathode leadframes so that each of said plurality of semiconductor dies can be activated on separate anode and cathode leadframes;
a white light emitting diode lamp that is capable of creating a substantially achromatic white light and that is encapsulated in a lens material that is mechanically connected to said lens material of said multicolored light emitting diode lamp to form said combined light emitting diode lamp, said combined light emitting diode lamp being capable of generating a substantially full spectrum of visible colors from said multicolored light emitting diode lamp, and that is capable of generating a substantially uniform and consistent white light that is substantially achromatic from said white light emitting diode lamp.

3. A combined light emitting diode lamp comprising:
a plurality of light emitting diodes having different colors that are encapsulated in a lens material, to form a multicolored light emitting diode lamp, said multicolored light emitting diode lamp having at least two leads for activating said multicolored light emitting diode lamp to emit a substantially full spectrum of visible colors, said multicolored light emitting diode lamp comprising:
a white light emitting diode lamp that is capable of creating a substantially achromatic white light and that is encapsulated in a lens material that is mechanically connected to said lens material of said multicolored light emitting diode lamp to form said combined light emitting diode lamp, said combined light emitting diode lamp being capable of generating a substantially full spectrum of visible colors from said multicolored light emitting diode lamp, and that is capable of generating a substantially uniform and consistent white light that is substantially achromatic from said white light emitting diode lamp, said white light emitting diode lamp being mechanically connected to said multicolored light emitting diode lamp by fitting said white light emitting diode lamp in a slot formed in a lens material of said multicolored light emitting diode lamp.

4. A method of generating a substantially full spectrum of visible colors and a white light that is substantially achromatic in a combined light emitting diode lamp comprising:
   providing a plurality of semiconductor dies that emit various spectral frequencies;
   providing a first lens that encapsulates said plurality of semiconductor dies;
   providing at least one semiconductor die that emits said white light that is substantially achromatic;
   providing a second lens that encapsulates said at least one semiconductor die that emits white light;
   mechanically connecting said first lens material and said second lens material to form said combined light emitting diode lamp.

5. The method of claim 4 wherein said process of mechanically connecting said first lens material and said second lens material comprises:
   forming a slot in said first lens material;
   inserting said second lens material in said slot with a frictional fit between said first lens material and said second lens material so that said second lens material is held firmly in said slot.

6. The method of claim 4 wherein said process of mechanically connecting said first lens material and said second lens material comprises bonding said first lens material and said second lens material using an adhesive.

7. The process of claim 4 further comprising:
   placing said plurality of semiconductor dies on a first leadframe;
   electrically connecting said plurality of semiconductor dies to said first leadframe and a second leadframe.

8. The process of claim 4 further comprising:
   placing said plurality of semiconductor dies on a plurality of first separate leadframes;
   electrically connecting each of said plurality of semiconductor dies to one of said plurality of first separate leadframes;
   electrically connecting each of said plurality of semiconductor dies to one of a plurality of second separate leadframes;
   controlling each of said plurality of semiconductor dies with power signals applied to lead connectors attached to said plurality of first separate leadframes and said plurality of second separate leadframes.

* * * * *